(12) United States Patent
Miyamoto et al.

(10) Patent No.: US 9,299,874 B2
(45) Date of Patent: Mar. 29, 2016

(54) COATING APPARATUS AND COATING METHOD

(75) Inventors: Hidenori Miyamoto, Kawasaki (JP);
Tadahiko Hirakawa, Kawasaki (JP);
Koichi Misumi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 79 days.

(21) Appl. No.: 13/878,964

(22) PCT Filed: Oct. 12, 2011

(86) PCT No.: PCT/JP2011/073392
§ 371 (c)(1),
(2), (4) Date: Jun. 24, 2013

(87) PCT Pub. No.: WO2012/050111
PCT Pub. Date: Apr. 19, 2012

(65) Prior Publication Data
US 2013/0280844 A1    Oct. 24, 2013

(30) Foreign Application Priority Data

Oct. 13, 2010    (JP) ................. 2010-230573

(51) Int. Cl.
*H01L 31/18*    (2006.01)
*H01L 21/67*    (2006.01)
(Continued)

(52) U.S. Cl.
CPC ............ *H01L 31/18* (2013.01); *H01L 21/6715* (2013.01); *H01L 21/6776* (2013.01); *H01L 21/67173* (2013.01); *H01L 31/0322* (2013.01); *B05D 1/26* (2013.01); *B05D 2252/02* (2013.01); *B05D 2252/04* (2013.01); *Y02E 10/541* (2013.01); *Y02E 10/543* (2013.01); *Y02P 70/521* (2015.11)

(58) Field of Classification Search
CPC ............... H01L 31/18; H01L 31/0322; H01L 21/67173; H01L 21/6776
USPC ............................................. 438/57; 118/323
See application file for complete search history.

(56) References Cited

U.S. PATENT DOCUMENTS 5,885,316 A * 3/1999 Sato et al. ........................ 65/324
6,563,330 B1 * 5/2003 Maruyama et al. ...... 324/754.14

(Continued)

FOREIGN PATENT DOCUMENTS

EP    0 318 315 A2    5/1989
JP    A-01-231313    9/1989

(Continued)

OTHER PUBLICATIONS

Titanium Data, Namekawa Keido Co., Ltd., retrieved on Apr. 27, 2010.

(Continued)

*Primary Examiner* — Selim Ahmed
(74) *Attorney, Agent, or Firm* — Knobbe Martens Olson & Bear LLP

(57) ABSTRACT

A coating apparatus including a coating part which has a nozzle which ejects a liquid material including an oxidizable metal from a tip portion, and a relative driving unit which moves a substrate and the nozzle in relation to each other so that the tip portion passes through the substrate, such that at least the tip portion of the nozzle provides an affinity control part which is formed so that affinity between the affinity control part and the liquid material is less than that between the liquid materials.

8 Claims, 11 Drawing Sheets

(51) Int. Cl.
  *H01L 21/677* (2006.01)
  *H01L 31/032* (2006.01)
  *B05D 1/26* (2006.01)

(56) References Cited

U.S. PATENT DOCUMENTS

| | | |
|---|---|---|
| 2003/0127048 A1 | 7/2003 | Kokubo et al. |
| 2005/0009229 A1 | 1/2005 | Mitzi |
| 2008/0102268 A1* | 5/2008 | Higasa et al. ............... 428/335 |
| 2009/0205714 A1 | 8/2009 | Kühnlein et al. |
| 2010/0010112 A1* | 1/2010 | Prenzel et al. ............... 522/86 |
| 2010/0093131 A1* | 4/2010 | Maeda ............... 438/107 |
| 2011/0059246 A1 | 3/2011 | Miyamoto et al. |
| 2011/0262757 A1* | 10/2011 | Lu et al. ............... 428/432 |

FOREIGN PATENT DOCUMENTS

| | | |
|---|---|---|
| JP | A-08-173878 | 7/1996 |
| JP | A-11-273783 | 10/1999 |
| JP | A-11-340482 | 12/1999 |
| JP | A-2000-140739 | 5/2000 |
| JP | A-2000-189877 | 7/2000 |
| JP | A-2003-266001 | 9/2003 |
| JP | A-2004-216298 | 8/2004 |
| JP | A-2005-051224 | 2/2005 |
| JP | A-2005-052820 | 3/2005 |
| JP | A-2007-010992 | 1/2007 |
| JP | A-2007-260639 | 10/2007 |
| JP | A-2009-537997 | 10/2009 |
| JP | A-2010-129660 | 6/2010 |
| JP | A-2011-078964 | 4/2011 |

OTHER PUBLICATIONS

International Search Report mailed on Dec. 27, 2011 in International Application No. PCT/JP2011/073392.

Office Action issued on Jul. 29, 2014 in Japanese Patent Application No. 2010-230573.

* cited by examiner

COATING APPARATUS AND COATING METHOD

This application is the U.S. National Phase under 35 U.S.C. §371 of International Application No. PCT/JP2011/073392, filed Oct. 12, 2011, designating the U.S., and published in Japanese as WO 2012/050111 on Apr. 19, 2012, which claims priority to Japanese Patent Application No. 2010-230573, filed Oct. 13, 2010, the entire content of which is incorporated herein by reference.

FIELD OF THE INVENTION

The present invention relates to a coating apparatus and a coating method.

Priority is claimed on Japanese Patent Application No. 2010-230573, filed Oct. 13, 2010, the content of which is incorporated herein by reference.

DESCRIPTION OF THE RELATED ART

A CIGS solar cell or a CZTS solar cell formed by semiconductor materials including a metal such as Cu, Ge, Sn, Pb, Sb, Bi, Ga, In, Ti, Zn, or a combination thereof, and a chalcogen element such as S, Se, Te, or a combination thereof has been attracting attention as a solar cell having high conversion efficiency (for example, see Patent Documents 1 to 3). For example, a CIGS solar cell has a structure in which a film including four types of semiconductor materials, in particular, Cu, In, Ga, and Se is used as a light absorbing layer (photoelectric conversion layer).

In a CIGS solar cell or a CZTS solar cell, since it is possible to reduce the thickness of the light absorbing layer compared to a conventional solar cell, it is easy to install the CIGS solar cell on a curved surface and to transport the CIGS solar cell. For this reason, it is expected that CIGS solar cells can be used in various fields of application as a high-performance, flexible solar cell. As a method of forming the light absorbing layer, a method of forming the light absorbing layer through depositing or sputtering is conventionally known (for example, see Patent Documents 3 to 5).

DOCUMENTS OF RELATED ART

Patent Documents

[Patent Document 1] Japanese Unexamined Patent Application, First Publication No. Hei 11-340482

[Patent Document 2] Japanese Unexamined Patent Application, First Publication No. 2005-51224

[Patent Document 3] Published Japanese Translation No. 2009-537997 of the PCT International Publication,

[Patent Document 4] Japanese Unexamined Patent Application, First Publication No. Hei 1-231313

[Patent Document 5] Japanese Unexamined Patent Application, First Publication No. Hei 11-273783

SUMMARY OF THE INVENTION

Technical Problem

Therefore, the present inventors provide a method for coating a film of the liquid material on a substrate as a method for forming a light absorbing layer by ejecting a liquid material in which the semiconductor materials are dispersed in the solution to a substrate by nozzle. In the case where a light absorbing layer is formed by coating of the liquid material, it is necessary that the liquid material is coated on the substrate without unevenness so that the thickness of the liquid material formed on the substrate is uniform.

Under the above circumstances, an object of the present invention is to provide a coating apparatus and a coating method, which can evenly coat the liquid material on the substrate.

Solution to Problem

A first aspect of the present invention is a coating apparatus including: a coating part which has a nozzle ejecting a liquid material including an oxidizable metal from an ejection portion provided at a tip portion, and a relative driving unit which moves a substrate and the nozzle in relation to each other while the tip portion and the substrate face each other, wherein at least the tip portion in the nozzle is provided with a affinity control part which is formed so that affinity between the affinity control part and the liquid material is less than that between the liquid materials.

According to the first aspect of the present invention, since at least the tip portion in the nozzle is provided with a affinity control part which is formed so that affinity between the affinity control part and the liquid material is less than that between the liquid materials, the liquid material ejected from the tip portion of the nozzle can be prevented from attaching to the tip portion. Accordingly, since the liquid material is readily fixed to the substrate, it is possible to evenly coat the liquid material on the substrate.

In the coating apparatus, the affinity control part is preferably provided at a portion including the tip portion of the nozzle and a portion adjacent to the tip portion of the nozzle.

In this case, since the affinity control part is preferably provided at a portion including the tip portion of the nozzle and a portion adjacent to the tip portion of the nozzle, the liquid material can be prevented from flowing along from the tip portion of the nozzle to the portion adjacent to the tip portion of the nozzle.

In the coating apparatus, preferably, the liquid material includes hydrazine, and the affinity control part is formed so that affinity between the affinity control part and the hydrazine is less than that between the hydrazine and another hydrazine.

In this case, since the liquid material includes hydrazine, and the affinity control part is formed so that affinity between the affinity control part and the hydrazine is less than that between the hydrazine and another hydrazine, the liquid material, which includes hydrazine, ejected from the tip portion of nozzle can be prevented from attaching to the tip portion. Accordingly, since the liquid material including the hydrazine is readily fixed to the substrate, it is possible to evenly coat the liquid material on the substrate.

In the coating apparatus, the affinity control part is preferably formed so that affinity between the affinity control part and the hydrazine is less than that between the hydrazine and the substrate.

In this case, since the affinity control part is preferably formed so that affinity between the affinity control part and the hydrazine is less than that between the hydrazine and the substrate, the liquid material including the hydrazine is readily fixed to the substrate rather than the affinity control part of the tip portion. Accordingly, it is possible to evenly coat the liquid material on the substrate.

In the coating apparatus, the affinity control part is preferably formed by using at least one of titanium and titanium alloy.

In this case, since the affinity control part is preferably formed by using at least one of titanium and titanium alloy, the liquid material is readily fixed to the substrate. Accordingly, it is possible to evenly coat the liquid material on the substrate.

In the coating apparatus, the substrate is preferably formed by using molybdenum.

In this case, since the liquid material is readily fixed to the substrate formed by using molybdenum, it is possible to evenly coat the liquid material on the substrate.

In the coating apparatus, the metal preferably includes at least one of copper, indium, gallium and selenium.

In this case, since a liquid material including at least one of copper, indium, gallium and selenium as the metal is readily fixed to the substrate, it is possible to evenly coat the liquid material on the substrate.

In the coating apparatus, preferably, the coating apparatus further includes a chamber surrounding at least one of a coating space, in which the liquid material is coated by the coating part, and a post-coating, transporting space for the substrate on which the liquid material is coated.

In this case, since the space at which the liquid material is disposed is surrounded by the chamber surrounding at least one of the coating space, in which the liquid material is coated by the coating part, and the post-coating, transporting space for the substrate on which the liquid material is coated, the liquid material can be prevented from deteriorating.

In the coating apparatus, preferably, the coating apparatus further includes an inert gas supply part supplying an inert gas to the space surrounded by the chamber.

In this case, since the inert gas is supplied to the space surrounded by the chamber, the liquid material can be further reliably prevented from deteriorating in the space surrounded by the chamber.

In the coating apparatus, preferably, the ejection portion of the coating part is formed to eject the liquid material to an ejecting region facing the tip portion, and the relative driving unit contains a substrate transporting unit transporting the substrate to pass the ejecting region.

In this case, since the coating part is formed to eject the liquid material to the ejecting region facing the tip portion and the relative driving unit contains the substrate transporting unit transporting the substrate to pass the ejecting region, it is possible to evenly coat the liquid material on the substrate, for example, by transporting the substrate without driving the nozzle.

In the coating apparatus, preferably, the ejection portion of the coating part is formed to eject the liquid material to an ejecting region facing the tip portion and the relative driving unit contains a nozzle driving unit driving the nozzle so that the ejecting region moves along the surface of the substrate.

In this case, since the coating part is formed to eject the liquid material to an ejecting region facing the tip portion, and the relative driving unit contains a nozzle driving unit driving the nozzle so that the ejecting region moves along the surface of the substrate, it is possible to evenly coat the liquid material on the substrate, for example, by driving the nozzle without transporting the substrate. The relative driving unit may also contain both of the substrate transporting unit and the nozzle driving unit. In this case, as relative movement, the relative driving unit may, for example, move the substrate, move the nozzle, and move both of the substrate and the nozzle.

A second aspect of the present invention is a method of coating a liquid material including an oxidizable metal on a substrate, including: directing a tip portion of a coating part, which has a nozzle ejecting the liquid material from a ejection portion formed on the tip portion, to the substrate so that the tip portion in the nozzle provides an affinity control part which is formed so that affinity between the affinity control part and the liquid material is less than that between the liquid materials, ejecting the liquid material from the ejection portion so that the liquid material is interposed and held between the tip portion and the substrate, and moving the tip portion and the substrate in relation to each other while ejecting the liquid material from the ejection portion with the liquid material being interposed and held between the tip portion and the substrate.

According to the second aspect of the present invention, since the affinity control part, which is formed so that affinity between the affinity control part and the liquid material is less than that between the liquid materials, is provided at the tip portion, and the tip portion of the nozzle on which the ejection portion of the liquid material is formed at the tip portion faces the substrate, and the liquid material is ejected from the ejection portion so that the liquid material is interposed and held between the tip portion and the substrate, the liquid material does not readily adhere to the tip portion and the liquid materials easily contact each other. In this state, when the substrate is moved while ejecting the liquid material from the ejection portion, since the liquid materials disposed on the substrate are to contact with each other on the substrate, the liquid material is readily fixed to the substrate without flowing along surface of the nozzle from the tip portion. Accordingly, it is possible to evenly coat the liquid material on the substrate.

Advantageous Effects of Invention

According to the present invention, it is possible to evenly coat the liquid material on the substrate.

DETAILED DESCRIPTION OF THE INVENTION

Figure 1:
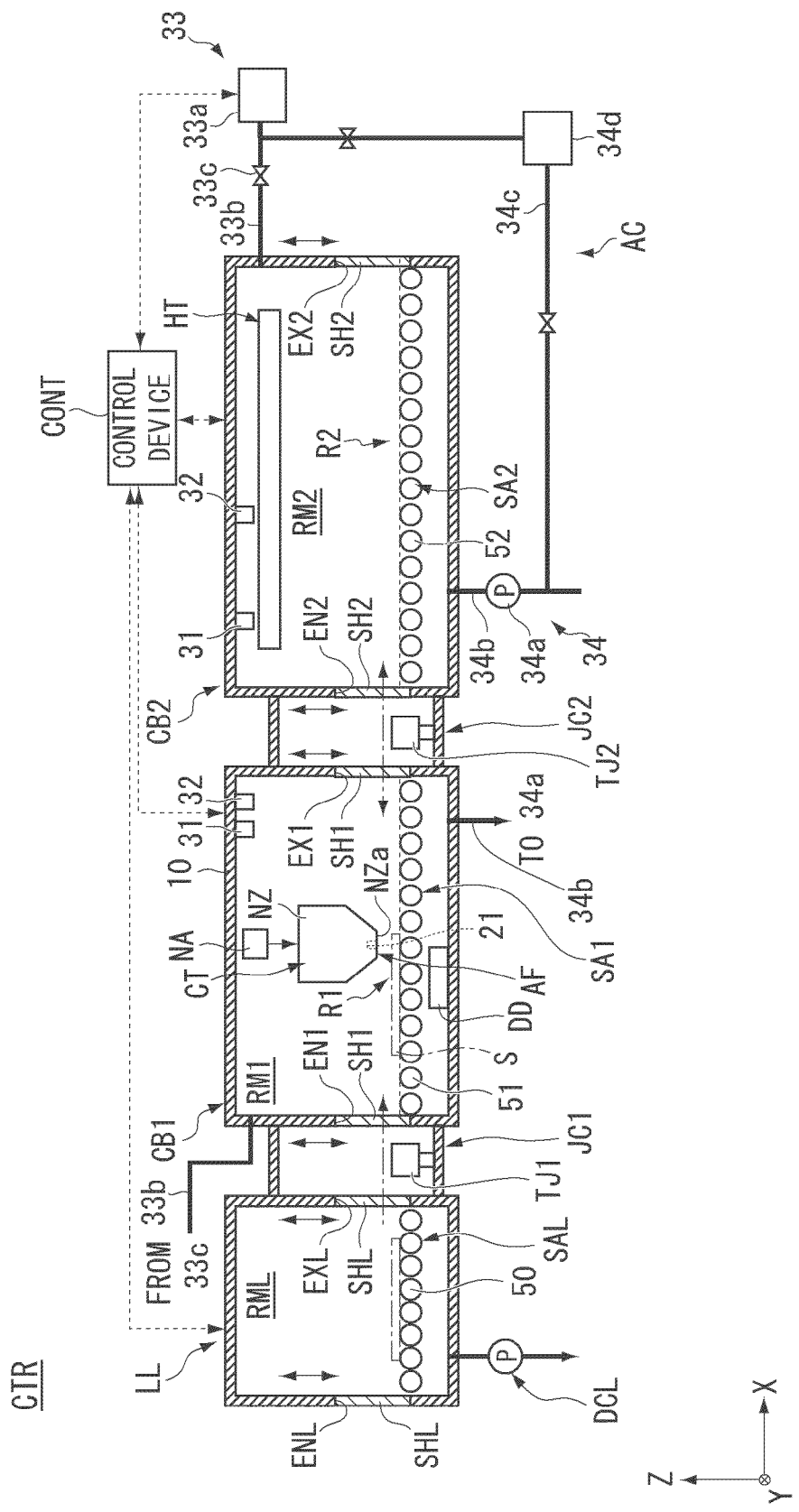
FIG. 1 is a diagram showing a configuration of a coating apparatus according to one embodiment of the present invention.

Hereinafter, one embodiment of the present invention will be described with reference to the accompanying drawings.

In the respective drawings as below, upon describing the configuration of a coating apparatus, for the purpose of simple marking, an XYZ coordinate system is used to describe the directions in the drawings. In the XYZ coordinate system, the horizontal direction in the drawing is marked as the X direction, and the direction perpendicular to the X direction in a plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

[Coating Apparatus]

FIG. 1 is a schematic diagram showing a configuration of a coating apparatus CTR according to one embodiment of the present invention.

As shown in FIG. 1, the coating apparatus CTR includes a load lock unit LL, a first chamber device CB1, and a second chamber device CB2. The load lock unit LL, the first chamber device CB1, and the second chamber device CB2 are connected in series, for example, in the X direction. The coating apparatus CTR is an apparatus which applies a liquid material on a substrate S. In this embodiment, a plate-like member which is formed, for example, by using a metal such as molybdenum is used as the substrate S.

In this embodiment, as the liquid material, for example, a liquid composition is used which includes a solvent such as hydrazine and oxidizable metals such as copper (Cu), indium (In), gallium (Ga), and selenium (Se). The liquid composition includes a metal material for forming a light absorbing layer (photoelectric conversion layer) of a CIGS solar cell or a CZTS solar cell. Needless to say, as the liquid material, a liquid material in which another oxidizable metal is dispersed in the solution may be used.

The load lock unit LL and the first chamber device CB1 are connected via a first connection room JC1. A first transporting device TJ1 which transports the substrate S from the load lock unit LL to the first chamber device CB1 is disposed on the first connection room JC1. The first chamber device CB1 and the second chamber device CB2 are connected via a second connection room JC2. A second transporting device TJ2, which transport the substrate S between the first chamber device CB1 and the second chamber device CB2, is disposed on the second connection room JC2.

The coating apparatus CTR according to the present embodiment may be in that the substrate S is loaded from the load lock unit LL to the coating apparatus CTR, and then the substrate S is unloaded from the second chamber device CB2 through the first chamber device CB1. Thus, in principle, transporting direction of the substrate S is to be the +X direction in the coating apparatus CTR.

(Load Lock Unit)

The load lock unit LL includes an accommodation room RML, a substrate loading opening ENL and a substrate unloading opening EXL. The substrate loading opening ENL is formed on the −X side wall portion of the accommodation room RML, and is, for example, connected to the outside. The substrate unloading opening EXL is formed on the +X side wall portion of the accommodation room RML, and is, for example, connected to the first connection room JC1. The substrate loading opening ENL and the substrate unloading opening EXL are openings formed to have a size which allows the substrate S to pass through.

The accommodation room RML is provided with a substrate placing unit SPL placing the substrate S and a substrate actuator mechanism SAL transporting the substrate S. The accommodation room RML has a depressurizing mechanism DCL (e.g., a pump mechanism) connected thereto. The substrate actuator mechanism SAL is a part which transports the substrate S inside the accommodation room RML.

The substrate actuator mechanism SAL includes a plurality of roller members 50. The roller members 50 are arranged in the X direction from the substrate loading opening ENL to the substrate unloading opening EXL. Each of the roller members 50 is adapted to be rotatable about the Y direction serving as the central axis. The plurality of roller members 50 are formed to have the same diameter, and are disposed at the same position in the Z direction. The +Z-direction-side upper ends of the roller members 50 are adapted to support the substrate S.

The rotation of each roller member 50 is controlled, for example, by a roller-rotation control part (not shown). As the substrate actuator mechanism SAL, a roller-type transporting mechanism as shown in FIG. 1 may be used, or a floating mechanism may be used to lift the substrate for transportation.

Each of the substrate loading opening ENL and the substrate unloading opening EXL is provided with a shutter member SHL. For example, the shutter member SHL is provided so that the substrate loading opening ENL and the substrate unloading opening EXL can be opened or closed by sliding the shutter member SHL in the Z direction. By closing the shutter member SHL, the accommodation room RML can be hermetically closed.

(First Chamber Device)

The first chamber device CB1 includes an accommodation room RM1, a substrate loading opening EN1 and a substrate unloading opening EX1. The accommodation room RM1 is adapted to accommodate the substrate S. The substrate loading opening EN1 and the substrate unloading opening EX1 are openings formed in the accommodation room RM1. The substrate loading opening EN1 is formed in, for example, the −X-direction-side end portion of the accommodation room RM1, and is connected to the first connection room JC1. The substrate unloading opening EX1 is formed in, for example, the +X-direction-side end portion of the accommodation room RM1, and is connected to the second connection room JC2. The substrate loading opening EN1 and the substrate unloading opening EX1 are openings formed to have a size which allows the substrate S to pass through.

Each of the substrate loading opening EN1 and the substrate unloading opening EX1 is provided with a shutter member SH1. For example, the shutter member SH1 is provided so that the substrate loading opening EN1 and the substrate unloading opening EX1 can be opened or closed by sliding the shutter member SH1 in the Z direction. By closing the shutter member SH1, the accommodation room RM1 can be hermetically closed.

The accommodation room RM1 is provided with a substrate actuator mechanism SA1, a coating part CT and a dummy discharge mechanism DD. Further, for example, the accommodation room RM1 has an ambience control part AC connected thereto which controls the ambience of the accommodation room RM1. The substrate actuator mechanism SA1 is a part which transports the substrate S inside the accommodation room RM1.

The substrate actuator mechanism SA1 includes a plurality of roller members 51. The roller members 51 are arranged in the X direction from the substrate loading opening EN1 to the substrate unloading opening EX1. The rotation of each roller member 51 is controlled, for example, by a roller-rotation control part (not shown). Like in the case of the substrate actuator mechanism SAL, as the substrate actuator mechanism SA1, a roller-type transporting mechanism may be used, or a floating mechanism may be used to lift the substrate for transportation.

The coating part CT is accommodated in the first chamber device CB1 of the accommodation room RM1. The coating part CT includes a slit nozzle NZ which is formed in an elongated shape. The slit nozzle NZ is provided, for example, in the vicinity of the substrate loading opening EN1 inside the accommodation room RM1. The slit nozzle NZ is formed to be elongated in, for example, the Y direction. The slit nozzle NZ is disposed, for example, at a middle portion in the X direction of the accommodation room RM1. On each of the +X side and −X side of the slit nozzle, a space sufficient for disposing the substrate S is ensured.

Figure 2A:
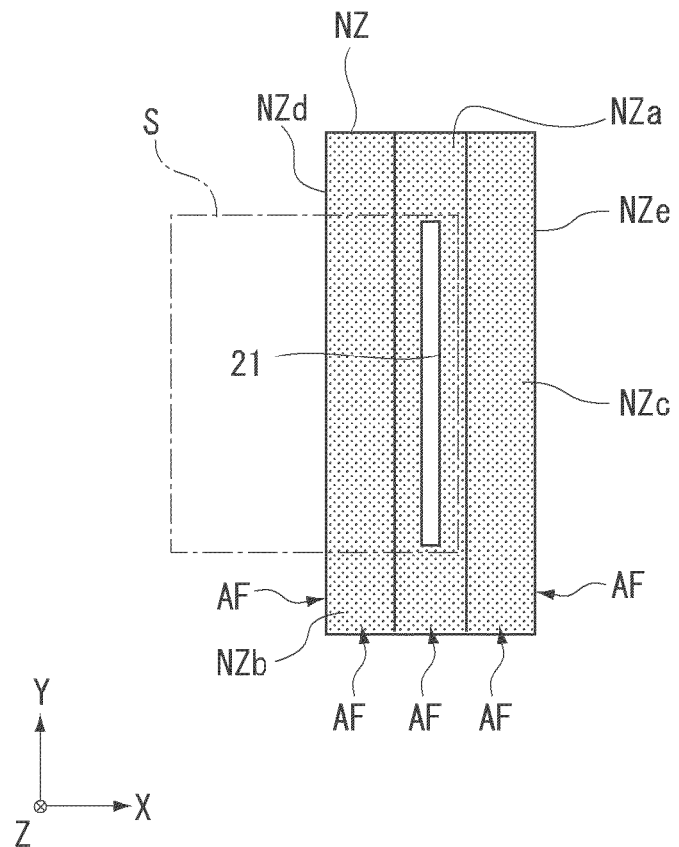
FIG. 2A is a diagram showing a configuration of a coating part of a coating apparatus according to the present embodiment.
Figure 2B:
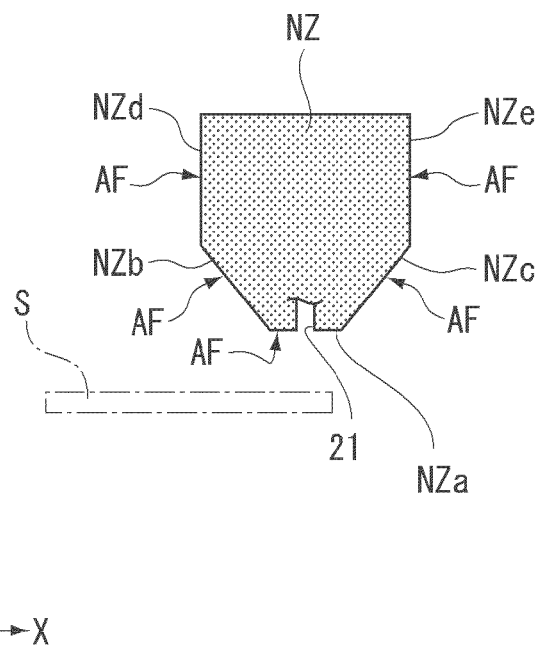
FIG. 2B is a diagram showing a configuration of a coating part of a coating apparatus according to the present embodiment.

FIG. 2A and FIG. 2B is a diagram showing a configuration of the slit nozzle NZ. FIG. 2A shows the configuration when the slit nozzle NZ is viewed toward the +Z direction side. FIG. 2B shows the configuration when the slit nozzle NZ is viewed toward the +Y direction side.

As shown in FIG. 2A and FIG. 2B, the slit nozzle NZ is formed to be elongated in, for example, the Y direction. On the tip portion NZa of the slit nozzle NZ in the −Z direction, a nozzle opening 21 in the form of a slit is provided along the lengthwise direction of the slit nozzle NZ. The size of the slit nozzle NZ in the X direction becomes smaller from the central portion in the Z direction to the tip portion NZa, so as to have a tapered configuration.

At a central portion of the tip portion NZa of the slit nozzle NZ, the nozzle opening 21 is formed. The nozzle opening 21 is formed in, for example, the Y direction so as to follow the longitudinal direction of the slit nozzle NZ. As shown in FIG. 2A, the nozzle opening 21 is formed, for example, so that the longitudinal direction thereof is substantially equal to the length in the Y-direction of the substrate S.

Figure 3:
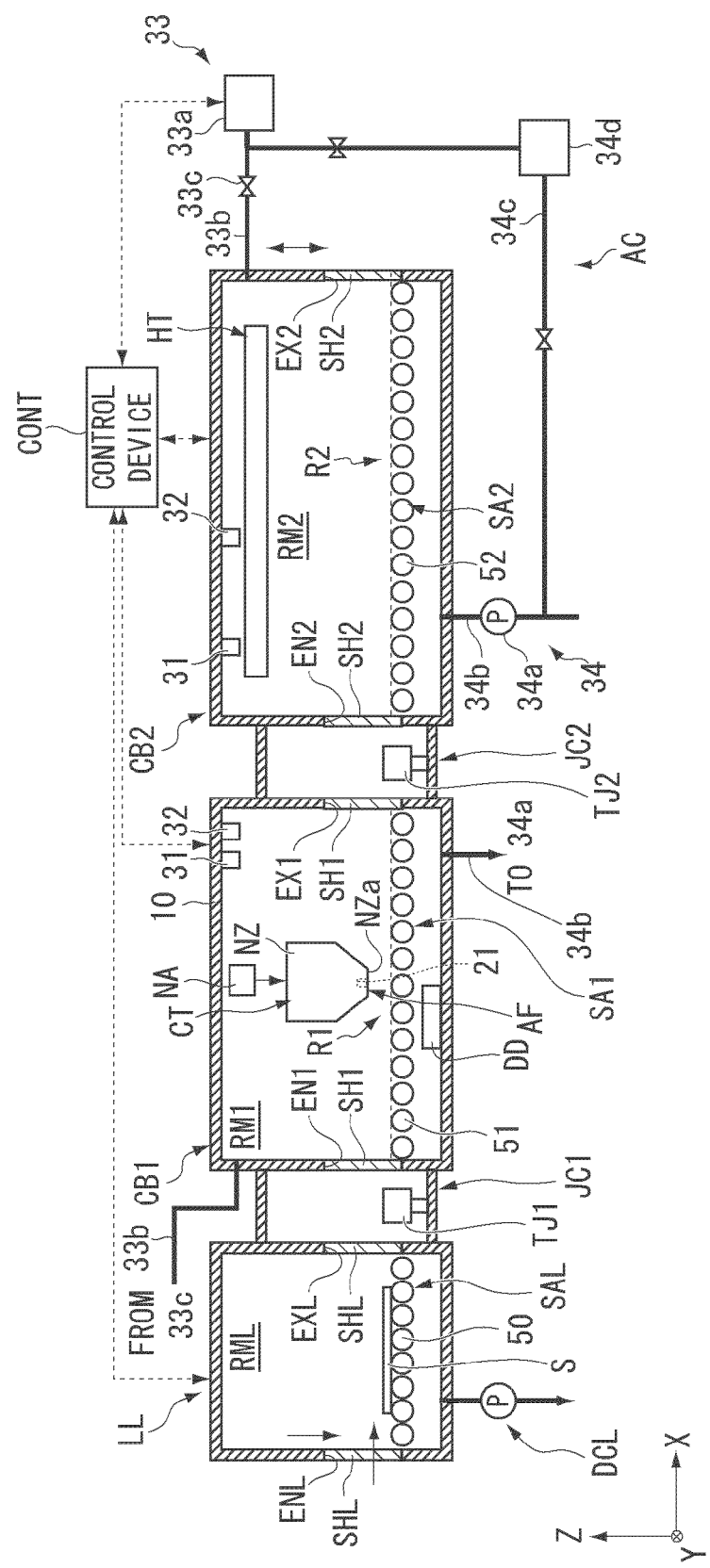
FIG. 3 is a diagram showing an operation of a coating apparatus according to the present embodiment.

The slit nozzle NZ ejects, for example, a liquid material Q in which four types of metals, in particular, Cu, In, Ga, and Se are mixed with a predetermined composition ratio from the nozzle opening 21 (see FIG. 3). The slit nozzle NZ is connected to a supply source (not shown) of the liquid material via a connection pipe (not shown). The slit nozzle NZ includes a holding portion which holds the liquid material therein.

The slit nozzle NZ includes a temperature controlling mechanism (not shown) which controls the temperature of the liquid material held by the holding portion.

The slit nozzle NZ is formed, for example, by using a material containing titanium and titanium alloy. As the material, for example, at least one selected from material (1)-(8), as show below in Table 1, is used. Some types of the material (1)-(8) may, of course, be used in combination.

TABLE 1

| material (1) | pure titanium JIS Type 1 |
| material (2) | pure titanium JIS Type 2 |
| material (3) | pure titanium JIS Type 3 |
| material (4) | pure titanium JIS Type 4 |
| material (5) | Ti—6Al—4V |
| material (6) | Ti—15V—3Cr—3Al—3Sn |
| material (7) | Ti—5Al—2.5Sn |
| material (8) | Ti—0.15Pd |

Each of the materials (1)-(8) has a property in which the affinity between each of the materials (1)-(8) and the liquid material Q mixed with the composition is less than that between the liquid materials Q. Specifically, each of the materials (1)-(8) has a property in which the affinity between each of the materials (1)-(8) and hydrazine included in liquid material Q is less than that between the hydrazine and another hydrazine. In this manner, the liquid material Q is difficult to being attached to the slit nozzle NZ formed by using the material (1)-(8).

In this embodiment, for example, the entire slit nozzle NZ is formed by using at least one selected from the materials (1)-(8). In this manner, on the entire surface of the slit nozzle NZ, an affinity control part AF, in which the affinity between the affinity control part AF and the liquid material Q is less than that of the liquid materials Q, is formed.

On the entire surface of the slit nozzle NZ, for example, a tip portion NZa and adjacent portion adjacent to the tip portion NZa are included. The adjacent portion is, for example, as shown in FIG. 2A and FIG. 2B, inclined portions NZb and NZc which are connected to +X-direction-side edge and −X-direction-side edge of the tip portion NZa of the slit nozzle NZ, respectively. Further, as the adjacent portion, a wall portion NZd and NZe may be connected on the +Z direction side of the inclined portion NZb and NZc, respectively.

By such a configuration in which the slit nozzle NZ of the present embodiment is formed by using at least one selected from the materials (1)-(8), the entire surface of the slit nozzle NZ including the affinity control part AF which is, for example, the tip portion NZa, the inclined portion NZb and NZc, and the wall portion NZd and NZe is configured so that the liquid material Q does not easily adhere thereto.

In addition, the materials (1)-(8) have a property in which the affinity between the materials (1)-(8) and hydrazine is less than that between molybdenum and hydrazine. In this embodiment, since the substrate S is formed by using molybdenum, the materials (1)-(8) have a property in which the affinity between the material (1)-(8) and hydrazine is less than that of the substrate S and hydrazine.

In other words, the liquid material Q is readily attached to the substrate S formed by using molybdenum rather than the slit nozzle NZ formed by using the materials (1)-(8). In this manner, the slit nozzle NZ is formed so that the liquid material Q ejected form the nozzle opening 21 does not readily adhere to the slit nozzle NZ, and the liquid material Q readily adheres to the substrate S.

The slit nozzle NZ is provided with a nozzle driving mechanism (see FIG. 1). The nozzle driving mechanism NA has a configuration capable of driving the slit nozzle NZ in the X direction, the Y direction and the Z direction. For example, the nozzle driving mechanism NA has a configuration capable of moving the slit nozzle NZ between a waiting position and a coating position (the position shown in FIG. 1) inside the accommodation room RM1.

The dummy ejection mechanism DD is provided at the waiting position of the slit nozzle NZ. The dummy ejection mechanism DD preliminarily ejects, for example, the liquid material. The dummy ejection mechanism is provided with, for example, a bubble sensor (not shown) which detects a bubble of the liquid material.

In the accommodation room RM1, a space on the −Z direction side of the slit nozzle NZ becomes a coating space R1 where the liquid material is applied to the substrate S. In the accommodation room RM1, a space on the +X direction side of the slit nozzle NZ becomes a portion of a post-coating, transporting space R2.

(Second Chamber Device)

Regarding FIG. 1, the second chamber device CB2 includes an accommodation room RM2, a substrate loading opening EN2 and a substrate unloading opening EX2. The accommodation room RM2 is adapted to accommodate the substrate S. The accommodation room RM2 becomes a portion of the post-coating, transporting space R2 for the substrate S. The substrate loading opening EN2 and the substrate unloading opening EX2 are openings formed in the accommodation room RM2. The substrate loading opening EN2 is formed in, for example, the −X-direction-side end portion of the accommodation room RM2, and is connected to the first connection room JC2. The substrate unloading opening EX2 is formed in, for example, the +X-direction-side end portion of the accommodation room RM2, and communicates to the outside. The substrate loading opening EN2 and the substrate unloading opening EX2 are openings formed to have a size which allows the substrate S to pass through.

Each of the substrate loading opening EN2 and the substrate unloading opening EX2 is provided with a shutter member SH2. For example, the shutter member SH2 is provided so that the substrate loading opening EN2 and the substrate unloading opening EX2 can be opened or closed by sliding the shutter member SH2 in the Z direction. By closing the shutter member SH2, the accommodation room RM2 can be hermetically closed.

The accommodation room RM2 is provided with a substrate actuator mechanism SA2 and a heating part HT. Further, for example, the accommodation room RM2 has an ambience control part AC connected thereto which controls the ambience of the accommodation room RM2. Similar to the substrate actuator mechanisms SAL and SA1, the substrate actuator mechanism SA2 is a part which transports the substrate S inside the accommodation room RM2.

The substrate actuator mechanism SA2 includes a plurality of roller members 52. The roller members 52 are arranged in the X direction from the substrate loading opening EN2 to the substrate unloading opening EX2. The rotation of each roller member 52 is controlled, for example, by a roller-rotation control part (not shown). Like in the case of the substrate actuator mechanisms SAL and SA1, as the substrate actuator mechanism SA2, a roller-type transporting mechanism may be used, or a floating mechanism may be used to lift the substrate for transportation.

The heating part HT heats the liquid material coated on the substrate S. The heating part HT includes a heating mechanism such as an infrared unit, a hot plate or an oven. By using the heating mechanism, the heating part HT is adapted to, for example, drying the liquid material or baking the liquid material.

(Ambience Control Part)

The ambience control part AC includes an oxygen concentration sensor 31, a pressure sensor 32, an inert gas supply part 33, and a discharge part 34.

The oxygen concentration sensor 31 and the pressure sensor 32 are provided in each of the accommodation room RM1 of the first chamber device CB1 and the accommodation room RM2 of the second chamber device CB2. The oxygen concentration sensor 31 detects the oxygen concentration inside the accommodation room RM1 and the accommodation room RM2, and transmits the detection result to the control device CONT. The pressure sensor 32 detects the pressure inside the accommodation room RM1 and the accommodation room RM2, and transmits the detection result to the control device CONT. In FIG. 1, the oxygen concentration sensor 31 and the pressure sensor 32 are mounted to the ceiling portion of the accommodation room RM1 and the accommodation room RM2, although they may be provided in other portions.

The inert gas supply part 33 supplies, for example, an inert gas such as nitrogen gas, argon gas or helium gas to the accommodation room RM1 and the accommodation room RM2. The inert gas supply part 33 includes a gas supply source 33a, a conduit 33b, and a supply amount adjusting part 33c. As the gas supply source 33a, for example, a gas cylinder or the like may be used.

One end of the conduit 33b is connected to the gas supply source 33a, and the other end thereof is branched and connected to the accommodation room RM1 and the accommodation room RM2. The end portions of the conduit 33b which is connected to the accommodation room RM1 and the accommodation room RM2 are respectively used as an inert gas supply port in the accommodation room RM1 and the accommodation room RM2. The inert gas supply port is disposed, for example, on ceiling of the accommodation room RM1 near −X side wall portion thereof. The inert gas supply port is also disposed, for example, on ceiling of the accommodation room RM2 near the +X side wall portion thereof.

The supply amount adjusting part 33c adjusts the amount of the inert gas supplied to the inside of the accommodation room RM1 and the accommodation room RM2. As the supply amount adjusting part 33c, for example, an electromagnetic valve or a valve which is manually opened or closed may be used. The supply amount adjusting part 33c is provided in, for example, the conduit 33b. The supply amount adjusting part 33c may be directly installed in, for example, the gas supply source 33a, instead of being disposed in the conduit 33b.

The discharge part 34 discharges gas in the accommodation room RM1 and the accommodation room RM2 to the outside. In addition, the discharge part 34 is used in the case reducing the pressure of the accommodation room RM1 and the accommodation room RM2 by discharging gas in the accommodation room RM1 and the accommodation room RM2. The discharge part 34 includes a discharge driving source 34a, a conduit 34b, a conduit 34c, and a removing member 34d. The discharge driving source 34a is branched and respectively connected inside the accommodation room RM1 and the accommodation room RM2 via the conduit 34b. As the discharge driving source 34a, for example, a pump or the like may be used. The conduit 34b has discharge ports at the end portions provided inside the accommodation room RM1 and the accommodation room RM2. These discharge ports are disposed, for example, on the bottom portions (on the −Z direction side) of the accommodation room RM1 and the accommodation room RM2.

By such a configuration in which the inert gas supply port is disposed on the +Z direction side of the accommodation room RM1 and the accommodation room RM2, and the discharge port is disposed on the −Z direction side of the accommodation room RM1 and the accommodation room RM2, the gas inside the accommodation room RM1 and the accommodation room RM2 flows in the −Z direction. In this manner, it is possible to suppress the gas inside the accommodation room RM1 and the accommodation room RM2 from whirling around.

One end of the conduit 34c is connected to the discharge driving source 34a, and the other end thereof is connected to the conduit 33b of the inert gas supply part 33. The conduit 34c is used as a circulation path which circulates the gas discharged by the discharge driving source 34a from the inside of the accommodation room RM1 and the accommodation room RM2 to the supply path. In this manner, the discharge part 34 is also used as a circulating mechanism which circulates the gas inside the accommodation room RM1 and the accommodation room RM2. The connection portion of the conduit 34c is not limited to the conduit 33b of the inert gas supply part 33, but for example, the conduit 34c may be directly connected to the inside of the accommodation room RM1 and the accommodation room RM2. In the conduit 34c, for example, valves are respectively provided on the upstream side and the downstream side of a removing member 34d.

The removing member 34d is provided inside the conduit 34c. As the removing member 34d, for example, an absorbing material for absorbing an oxygen component and moisture contained in the gas circulating in the conduit 34c is used. In this manner, it is possible to clean the circulated gas. The removing member 34d may be disposed at one position inside the conduit 34c, or may be disposed throughout the conduit 34c.

(Control Device)

The control device CONT controls the overall operations of the coating apparatus CTR. Specifically, the control device CONT controls the operations of the load lock unit LL, the first chamber device CB1, the second chamber device CB2 and the ambience control part AC. For example, the control device CONT controls operations such as an opening and closing operation of the shutter member SHL, SH1 and SH2, a operation of the substrate actuator mechanism SAL, SA1 and SA2, a coating operation by the coating part CT, a heating operation by the heating part HT, and the adjusting operation by the ambience control part AC.

As an example of the adjusting operation, the control device CONT controls an opening degree of the supply amount adjusting part 33c of the inert gas supply part 33 based on the detection result obtained by the oxygen concentration sensor 31 and the pressure sensor 32. The control device has, for example, a timer or the like (not shown) for measuring the treatment time.

[Coating Operation]

Next, a coating operation according to the present embodiment will be described. In this embodiment, a coating film is formed on the substrate S by using the coating apparatus CTR having the above-described configuration. The operations performed by each portion of the coating apparatus CTR are controlled by the control device CONT.

The control device CONT closes the shutter members SAL, SA1 and SA2, which are provided in the coating apparatus CTR. In this state, when the substrate S is transported from the outside to the coating apparatus CTR, the control device CONT opens the shutter member SHL, which is provided at the substrate loading opening ENL of the load lock unit LL, and then the control device CONT loads the substrate S into the accommodation room RML from the substrate loading opening ENL.

As shown in FIG. 3, after loading the substrate S into the accommodation room RML, the control device CONT closes the shutter member SHL of the substrate loading opening ENL, and then the control device CONT controls the accommodation room RML so as to be in a hermetically closed state.

After controlling the accommodation room RML to be in a hermetically closed state, the control device CONT controls the accommodation room RML in a reduced pressure state by using the depressurizing mechanism DCL.

The control device CONT confirms the accommodation room RM1 of the first chamber device CB1 and the accommodation room RM2 of the second chamber device CB2 in a hermetically closed state, and then the control device CONT adjusts the atmosphere inside the accommodation room RM1 and RM2 to become an inert gas atmosphere. More specifically, an inert gas is supplied to the inside of the accommodation room RM1 and the accommodation room RM2 by using the inert gas supply part 33. In this case, the control device CONT may adjust the pressure inside the accommodation room RM1 and the accommodation room RM2 by appropriately operating the exhaust part 34.

In addition, the control device CONT controls the holding portion of the slit nozzle NZ to hold the liquid material therein. The control device CONT controls the temperature of the liquid material held by the holding portion by using the temperature controlling mechanism inside the slit nozzle NZ. In this manner, the control device CONT controls the slits nozzle NZ so as to be in a state capable of ejecting the liquid material to the substrate S.

Figure 4:
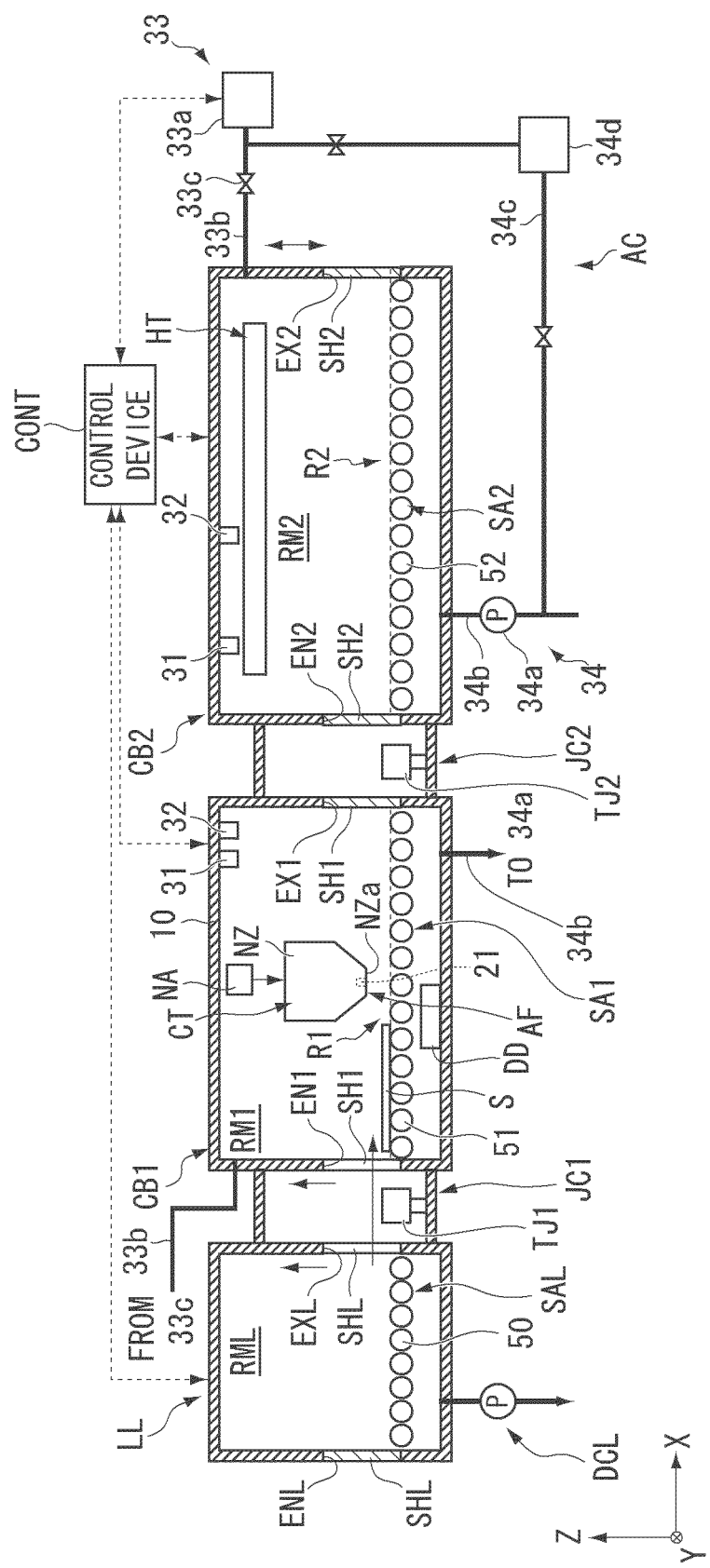
FIG. 4 is a diagram showing an operation of a coating apparatus according to the present embodiment.

When the coating apparatus CTR is in a state capable of discharging the liquid material to the substrate S, as shown in FIG. 4, the control device CONT opens the substrate unloading opening EXL of the load lock chamber device LL and the substrate loading opening EN1 of the first chamber device CB1, and transports the substrate S from the load lock chamber device LL to load the substrate S into the accommodation room RM1 of the first chamber device CB1 via the first junction room JC1.

Figure 5:
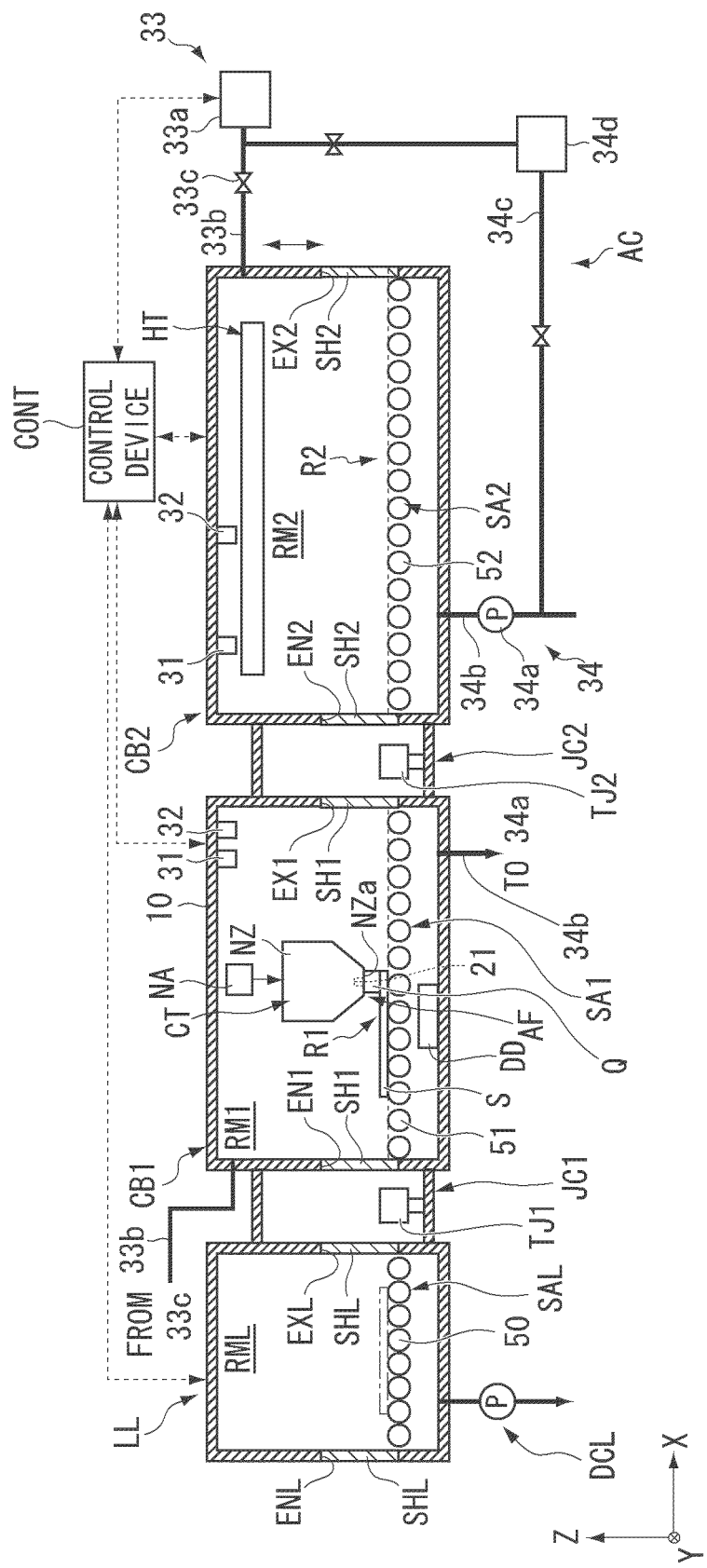
FIG. 5 is a diagram showing an operation of a coating apparatus according to the present embodiment.

After the substrate S is loaded, the control device CONT rotates the roller members 51 of the substrate actuator mechanism SA1 so as to move the substrate S in the +X direction. When the +X-direction-side edge of the substrate S arrives at a position overlapping with the nozzle opening 21 of the slit nozzle NZ as viewed from the Z direction, as shown in FIG. 5, the control device CONT uses the slit nozzle NZ to apply a liquid material Q to the substrate S.

In this case, the control device CONT moves the slit nozzle NZ and the substrate S in relation to each other, for example, in this embodiment, the control device CONT moves the substrate S in the +X direction, to face the tip portion NZa of the slit nozzle NZ to the substrate S. After facing the tip portion NZa and the substrate S, the control device CONT, as shown in FIG. 5, controls the liquid material Q being ejected from the nozzle opening 21 with the liquid material being interposed and held between the tip portion NZa and the substrate S.

Here, when the affinity of the tip portion NZa for the liquid material Q is more than that between the liquid materials Q, the liquid material Q contacts the tip portion NZa rather than the liquid materials Q contacting each other. Thus, since the liquid material Q is attached to the tip portion NZa, adherence property of the liquid material Q to the substrate S is decreased. Furthermore, when the affinity of the tip portion NZa for the liquid material Q is not only more than that between the liquid materials Q but also the affinity of the inclined portion NZb, NZc, which is the adjacent portion, to the liquid material Q is more than that between the liquid materials Q, the adherence property of the liquid material Q to the substrate S is further decreased because the liquid material Q flows from the tip portion NZa to the inclined portion NZb, NZc. In addition, the affinity of the tip portion NZa (and the adjacent portion) for the liquid material Q is more than that between the liquid material Q and the substrate S, since the liquid material Q adheres to the tip portion NZa (and the adjacent portion) rather than the substrate S, in this case, the adherence property of the liquid material Q to the substrate S is also decreased.

Conversely, in the present embodiment, since the entire slit nozzle NZ is formed by using at least one selected from the materials (1)-(8) as show in Table 1, for example, the affinity of the tip portion NZa (affinity control part AF) of the slit nozzle NZ for the liquid material Q is less than that between the liquid material Q. Further, the affinity of the tip portion NZa for the liquid material Q is less than that between the substrate S and the liquid material Q.

Thus, as described above, by interposing the liquid material Q between the tip portion NZa of the slit nozzle NZ and the substrate S, the liquid material Q does not readily adhere to the tip portion NZa, and the liquid materials Q easily contact each other. Further, the liquid material Q readily adheres to the substrate S rather than the tip portion NZa.

The control device CONT, in this state, moves the substrate S while ejecting the liquid material Q from the nozzle opening 21. According to the operation, the liquid material Q is disposed on the substrate S and can be fixed to the substrate S without flowing from the tip portion NZa to the inclined portion NZb, the inclined portion NZc or the like.

Figure 6:
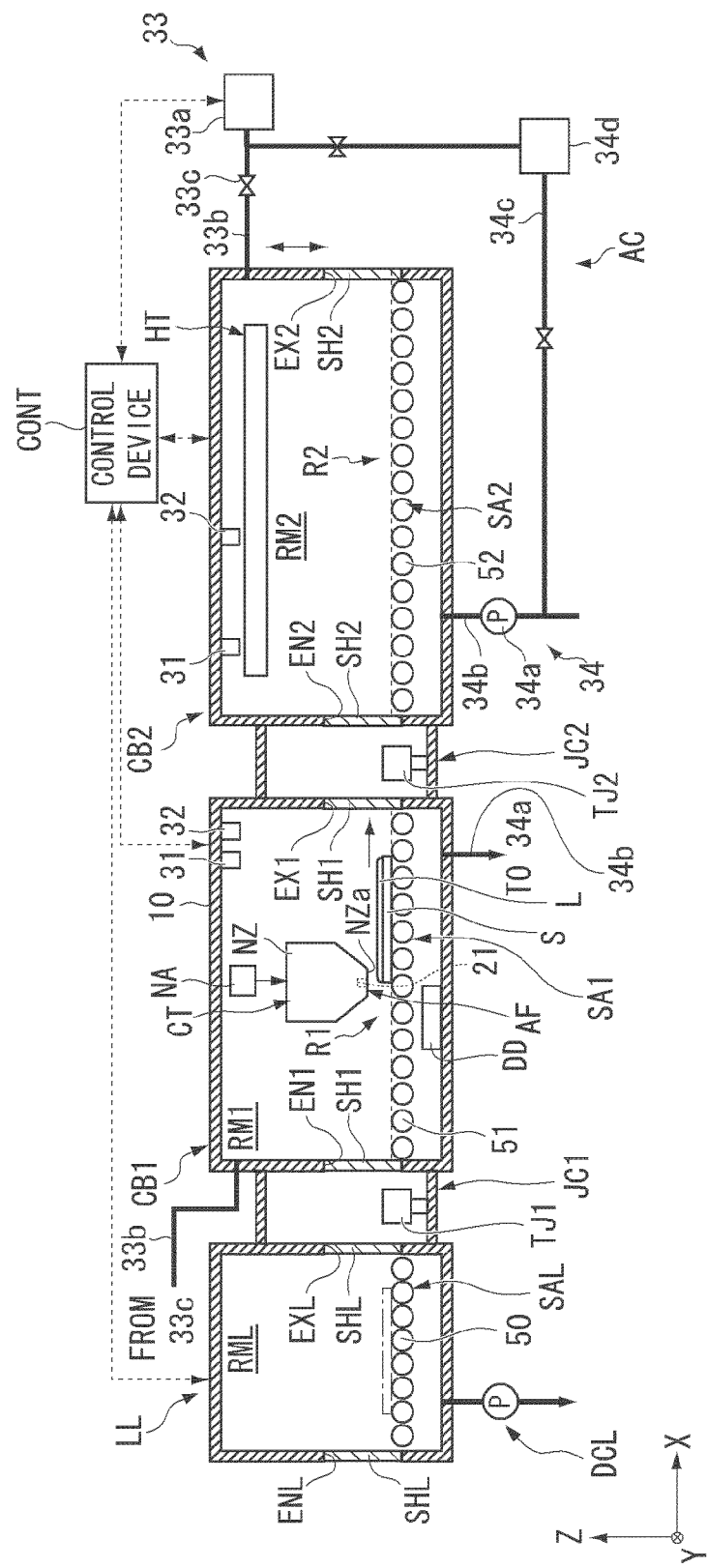
FIG. 6 is a diagram showing an operation of a coating apparatus according to the present embodiment.

Further, due to the affinity between the liquid materials Q disposed on the substrate S, when the substrate S is distanced from the nozzle opening 21, the liquid material Q applied to the substrate S attracts the liquid material Q on the tip portion NZa. Thus, as shown in FIG. 6, a coating film L of the liquid material is formed on a predetermined region of the substrate S with uniform thickness. After the coating film L is formed on the substrate S, the control device CONT stops the operation of ejecting the liquid material from the nozzle opening 21.

Figure 7:
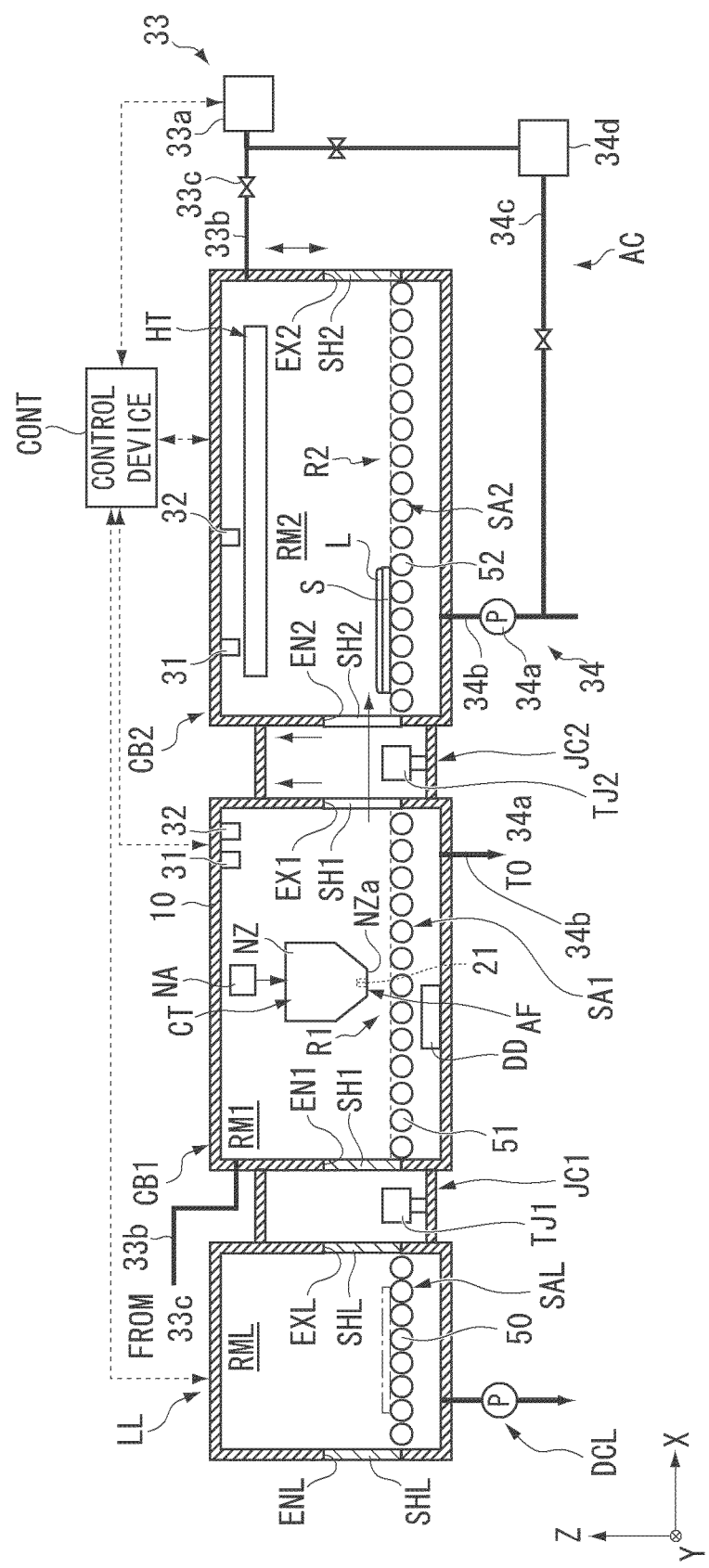
FIG. 7 is a diagram showing an operation of a coating apparatus according to the present embodiment.

After the ejecting operation stops, the control device CONT accommodates the substrate S having the coating film L formed thereon in the accommodation room RM2 of the second chamber device CB2. Specifically, as shown in FIG. 7, the control device CONT opens the substrate unloading opening EX1 of the accommodation room RM1 and the substrate loading opening EN2 of the accommodation room RM2, and transports the substrate S through the substrate unloading opening EX1, the second junction room JC2 and the substrate loading opening EN2 to load the substrate S into the accommodation room RM2.

Figure 8:
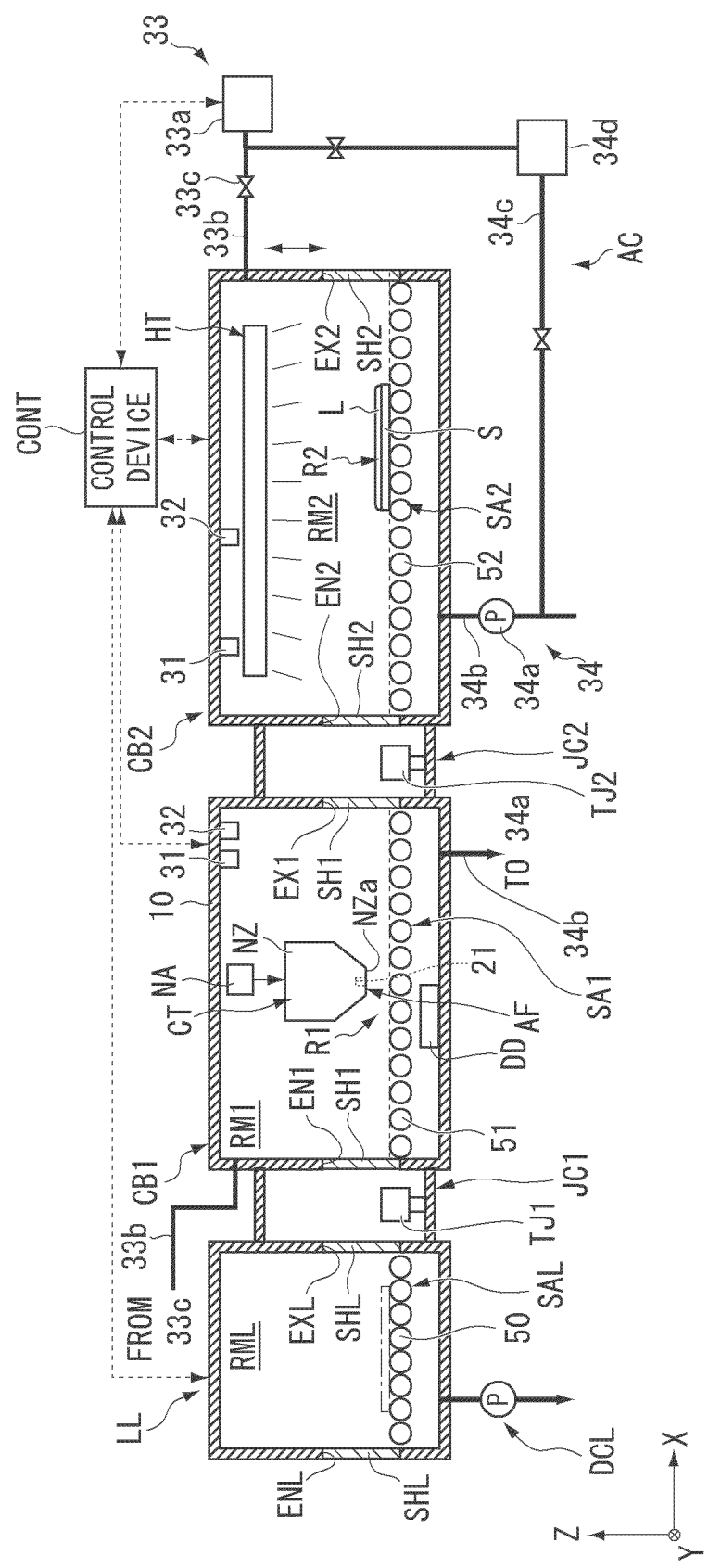
FIG. 8 is a diagram showing an operation of a coating apparatus according to the present embodiment.

After loading the substrate S into the accommodation room RM2, as shown in FIG. 8, the control device CONT transports the substrate S to a position on the −Z side of the heating part HT, and then operates the discharge part 34 to reduce the pressure inside the accommodation room RM2. After the pressure inside the accommodation room RM2 has been reduced, the control device CONT operates the heating part HT to heat the coating film on the substrate S. By heating the liquid material under reduced pressure, the coating film L can be efficiently dried in a short amount of time.

In the drying operation, the heat treatment may be performed without reducing the pressure inside the accommodation room RM2. Further, in the drying operation, the decompression treatment of the accommodation room RM2 may be performed without heating the coating film on the substrate S. Furthermore, after performing the decompression treatment, the heat treatment may be performed.

In the heating step, for example, the heating temperature can be controlled to 300° C. or less. Further, for example, the heating temperature can be also controlled to 50° C. or more. By controlling the heating temperature to 300° C. or less, even when the substrate S is made of a resin material, the heat treatment can be performed without deformation of the substrate S. Hence, the substrate S can be selected from a variety of materials.

The control device CONT, for example, stops the rotation operation of the roller members 52, and operates the heating part HT while the substrate S is in a stationary state. For example, the time required for drying the coating film L on the substrate S and/or the heating temperature is memorized in advance, and the control device CONT performs a heating operation of the coating film L by controlling the heating time and the heating temperature on the basis of the memorized values.

Further, while the control device CONT performs the rotation operation of the roller members 52, the substrate S may pass under the heating part HT. On the occasion, the heating part HT may have a thermal gradient from the −X direction to the +X direction. In this case, since the substrate S is gradually heated and then the heat treatment is performed at a desired temperature in a predetermined time and after that the substrate S is gradually cooled, the substrate S and the film including the oxidizable metal coated on the substrate S can be dried without any stress.

In the case where part of a light absorbing layer is formed by coating the liquid material Q including oxidizable metals on the substrate S, for example, since Cu, In and the like are metals which are susceptible to oxidation (oxidizable metals), when the oxygen concentration inside the accommodation room RM1 and the accommodation room RM2 is high, the oxidizable metals are oxidized. When the metals are oxidized, the film quality of the coating film formed on the substrate S may deteriorate.

Thus, the control device CONT uses the condition adjusting part AC to adjust the atmosphere inside the accommodation room RM1 and the accommodation room RM2 to become an inert gas atmosphere. More specifically, the control device CONT supplies an inert gas such as a nitrogen gas or an argon gas to the inside of the accommodation room RM1 and the accommodation room RM2 by using the inert gas supply part 33.

In the supplying step, the control device CONT first detects the oxygen concentration inside the accommodation room RM1 and the accommodation room RM2 by using the oxygen concentration sensor 31. The control device CONT adjusts the inert gas supply amount by using the supply amount adjusting part 33c based on the detection result obtained in the detecting step, and supplies the inert gas to the inside of the accommodation room RM1 and the accommodation room RM2. For example, when the detected oxygen concentration exceeds a predetermined threshold value, it is possible to supply the inert gas into the accommodation room RM1 and the accommodation room RM2. The threshold value may be obtained in advance by a test or simulation, and may be stored in the control device CONT. In addition, for example, a predetermined amount of the inert gas may be constantly supplied into the accommodation room RM1 and the accommodation room RM2 during the coating operation and the drying operation, and the inert gas supply amount can be increased or decreased based on the detection result of the oxygen concentration sensor 31.

In the supplying step, the control device CONT uses the oxygen concentration sensor 31, and also detects the atmospheric pressure inside the accommodation room RM1 and the accommodation room RM2 by using the pressure sensor 32. The control device CONT adjusts the inert gas supply amount by using the supply amount adjusting part 33c based on the detection result obtained by the pressure sensor 32, and supplies the inert gas to the inside of the accommodation room RM1 and the accommodation room RM2. For example, when the atmospheric pressure inside the accommodation room RM1 and the accommodation room RM2 exceeds a predetermined threshold value, the gas inside the accommodation room RM1 and the accommodation room RM2 is exhausted by using the exhaust part 34. This threshold value may be obtained in advance by a test or simulation, and may be stored in the control device CONT. In addition, for example, a predetermined amount of the gas inside the accommodation room RM1 and the accommodation room RM2 may be constantly discharged during the coating operation and the drying operation, and the discharge amount can be increased or decreased based on the detection result of the pressure sensor 32. In this manner, the inside of the accommodation room RM1 and the accommodation room RM2 can be maintained under reduced pressure.

The gas exhausted from the exhaust part 34 is circulated to the conduit 33b of the inert gas supply part 33 via the conduits 34b and 34c. When the gas flows through the conduit 34c, the gas passes through the removing member 34d. When the gas passes through the removing member 34d, the oxygen component in the gas is adsorbed by the removing member 34d so as to be removed from the gas. In this manner, an inert gas having a low oxygen concentration is circulated to the conduit 33b. By circulating the gas inside the accommodation room RM1 and the accommodation room RM2, it becomes possible to supply the inert gas under stable temperature conditions.

As described above, according to the embodiment, since at least the tip portion NZa in the slit nozzle NZ is provided with the affinity control part AF which is formed so that the affinity between the affinity control part AF and the liquid material Q is less than that between the liquid materials Q, the liquid material Q ejected from the tip portion NZa of the slit nozzle NZ can be prevented from adhering to the tip portion NZa. Accordingly, since the liquid material Q is readily fixed to the substrate S, it is possible to coat the liquid material Q on the substrate S without unevenness.

The technical scope of the present invention is not limited to the above-described embodiment, but may be appropriately modified into various forms without departing from the spirit of the present invention.

For example, in the above-described embodiment, the entire slit nozzle NZ is configured by using at least one selected from the materials (1)-(8) as shown in FIG. 1, but the invention is not limited thereto.

Figure 9:
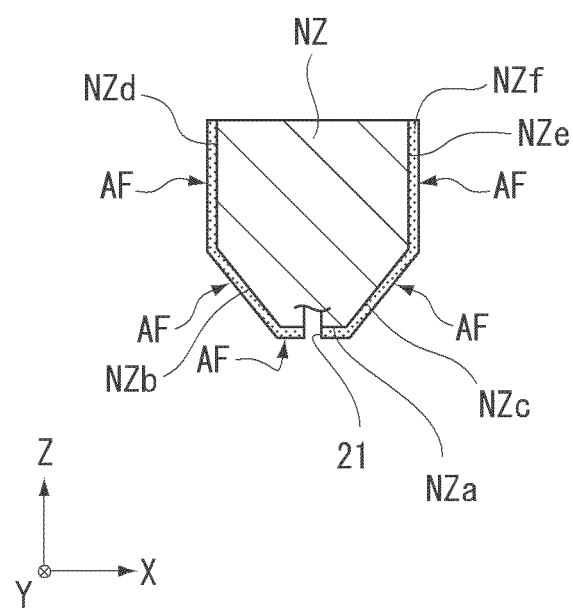
FIG. 9 is a diagram showing another configuration of a coating apparatus according to the present embodiment.

For example, as shown in FIG. 9, the slit nozzle NZ may have a covering portion NZf formed so that the covering portion NZf covers the tip portion NZa, the inclined portion NZb and NZe, and the wall portion NZd and NZe thereof. The covering portion NZf may be formed by using at least one selected from the materials (1)-(8). For example, the above-described covering portion NZf can be formed on surface of the slit nozzle NZ through coating or depositing. Even when the covering portion NZf is provided at the surface of the slit nozzle NZ, the affinity control part AF may be formed on the portion in which the covering portion NZf is provided. In this case, portions of the slit nozzle NZ except the covering portion NZf may be formed by using a material different from the materials (1)-(8).

Figure 10:
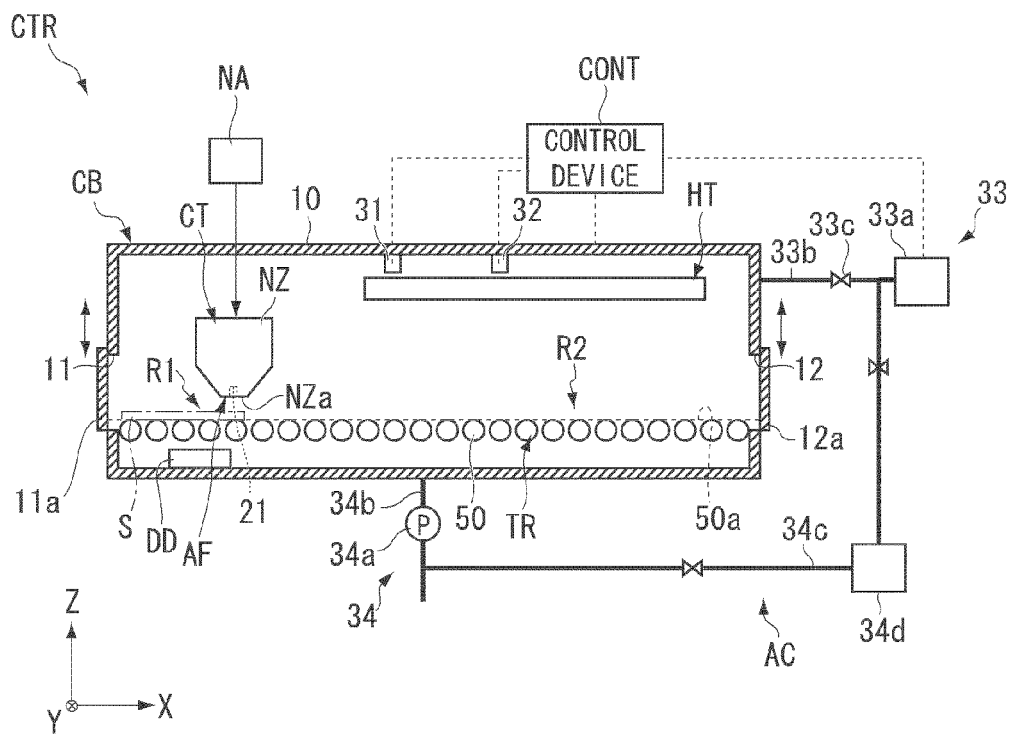
FIG. 10 is a diagram showing another configuration of a coating apparatus according to the present embodiment.

Further, in the above-described embodiment, a configuration has been described in which the coating part CT and the heating part HT are disposed on each chamber device (the first chamber device CB1 and the second chamber device CB2), but the invention is not limited thereto. The coating part CT and the heating part HT may be disposed on one chamber device CB. For example, as shown in FIG. 10, the coating part CT and the heating part HT may be disposed on the same space inside one chamber device CB. In this case, a space on the −Z direction side of the coating part CT becomes the coating space R1, and a space on the +X direction side of the coating space becomes the post-coating, transporting space R2.

Figure 11:
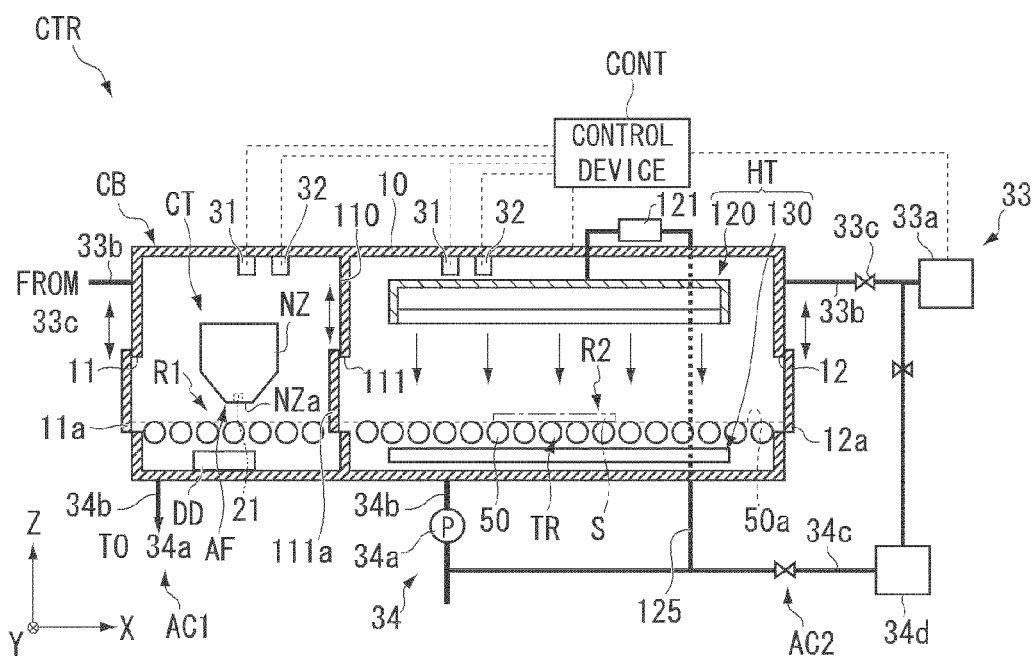
FIG. 11 is a diagram showing another configuration of a coating apparatus according to the present embodiment.

Further, as shown in FIG. 11, the space inside the chamber CB may be separated into two spaces so that the slit nozzle NZ and the heating part HT can be disposed in each space. A partition member 110 is provided inside the chamber CB. The partition member 110 is arranged on the transporting path of the substrate S. Therefore, the substrate S is transported so as to pass through the partition member 110.

The partition member 110 is provided with an opening 111 formed in a region corresponding to the height position (a position in the Z direction) of the substrate S. The opening 111 is provided with a cover portion 111a so as to open or close the opening 111. When transporting the substrate S, the cover portion 111a is in an open state while the substrate S passes through the partition member 110. When the substrate S does not pass through the partition member 110 or a process is being performed in each section, the cover portion 111a is in a closed state.

An oxygen concentration sensor 31 which detects the oxygen concentration inside the chamber CB and a pressure sensor 32 which detects the pressure inside the chamber CB are provided in each of the sections formed by the partition member 110. Each of the two sections also has a condition adjusting part connected thereto. The section with the slit nozzle disposed therein has an ambience control part AC1 connected thereto. The ambience control part AC1 is formed to have the same configuration as that of the ambience control part AC in the first embodiment.

The section provided with the heating part HT has an ambience control part AC2 connected thereto. In addition to the configuration of the ambience control part AC1 (or the ambience control part AC described in the first embodiment), the ambience control part AC2 has a branch conduit 125 which diverges from the conduit 34c. Thus, like the conduit 34c, the branch conduit 125 also allows the gas exhausted by the exhaust driving source 34a to flow therethrough.

The branched conduit 125 is connected to, for example, a heat accumulating mechanism 120. The branch conduit 125 is provided with a heating mechanism 121 which heats the gas flowing through the branch conduit 125. The branch conduit 125 may also be provided with a removing member that removes oxygen (e.g., a member having the same structure as that of the removing member 34d in the first embodiment).

The heating part HT has a heat accumulating mechanism 120 and a hot plate 130. The heat accumulating mechanism 120 is provided on the ceiling side of the chamber CB as viewed from the transporting region of the substrate S, and the hot plate 130 is provided on the bottom side of the chamber S as viewed from the transporting region of the substrate S. Like the heating part HT in the first embodiment, the hot plate 130 is provided with a heating mechanism (not shown).

The heat accumulating mechanism 120 is capable of accumulating the heat of the gas inside the chamber CB. The heat accumulating mechanism 120 is supplied with the gas which flows through the branch conduit 125. Thus, in the heat accumulating mechanism 120, the heat from the supplied gas is maintained at the same temperature as the temperature inside the chamber. The heat accumulating mechanism 120 has an opening on the −Z side thereof, and the gas from the branch conduit 125 is allowed to flow through the opening into the chamber CB.

In this embodiment, since the slit nozzle NZ and the heating part HT are provided in different sections, the coating step and the heating step are performed in different sections of a single chamber CB. In such a case, the control device CONT first performs the coating step of the substrate S in the section provided with the slit nozzle NZ. After the coating step has been completed, the control device CONT opens the cover portion 111a and transports the substrate S to the section provided with the heating part HT.

After the substrate S has been transported, the control device CONT closes the cover portion 111a and reduces the pressure inside the section provided with the heating part HT.

After reducing the pressure, the control device CONT operates the heating part HT to perform the heating step of heating the liquid material on the substrate S. In the heating step, the substrate S is heated from the upper side and the bottom side by the heat accumulating mechanism 120 and the hot plate 130, respectively. In the heating step, the gas exhausted from this section (e.g., inert gas) is supplied to the heat accumulating mechanism 120 through the branch conduit 125. The gas supplied to the heat accumulating mechanism 120 is heated by the accumulated heat, and the temperature of the gas is adjusted to about the same temperature as that inside this section (gas heating step). The heated gas is supplied into the section through the opening of the heat accumulating mechanism 120 to be reused. In the gas heating step, the gas may be heated using the heat mechanism 121 provided on the branch conduit 125.

After the heating step, the control device CONT stops the operation of the heating part HT and returns the pressure inside the chamber CB (the pressure inside the section) to atmospheric pressure. Thereafter, the control device CONT opens the cover portion 12a while maintaining the cover portion 111a closed, and transports the substrate S in the +X direction to unload the substrate S.

Further, in the above-described embodiment, as the coating operation, a configuration has been described in which, by moving the substrate S while the slit nozzle NZ is stationary, the liquid material Q is applied to the substrate S, but the invention is not limited thereto. By moving the slit nozzle NZ while the substrate S is stationary, the liquid material Q may be applied to the substrate S. Further, both of the substrate S and the slit nozzle NZ may be moved.

Figure 12:
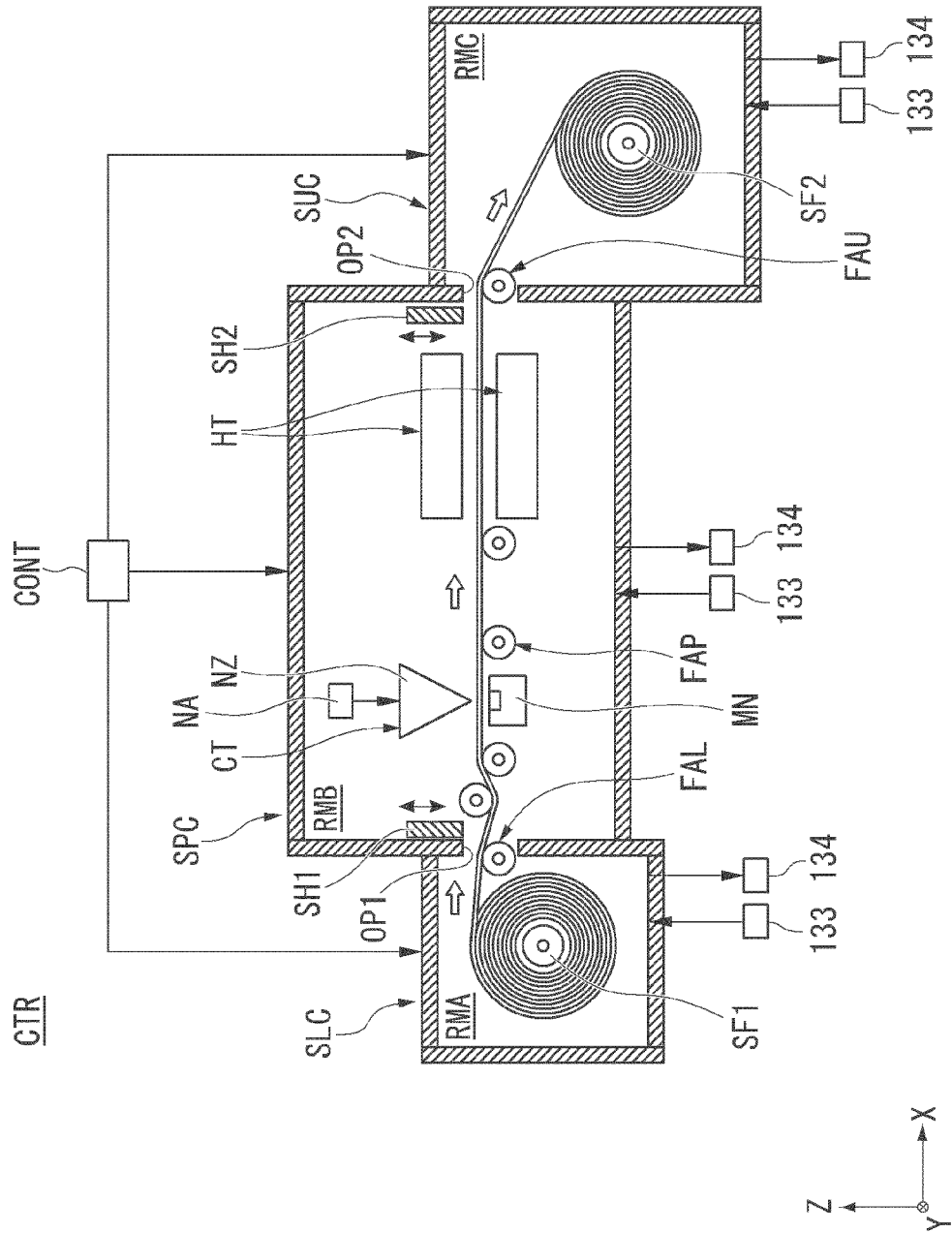
FIG. 12 is a diagram showing another configuration of a coating apparatus according to the present embodiment.

Further, in the above-described embodiment, a configuration has been described in which the coating film including the oxidizable metal is formed on the substrate S, but the invention is not limited thereto. For example, as shown in FIG. 12, the liquid material Q may be applied to a belt-like film. FIG. 12 is a diagram showing another configuration of the coating apparatus CTR. As shown in FIG. 12, the coating apparatus CTR has a substrate loading chamber SLC, a substrate processing chamber SPC, a substrate unloading chamber SUC, and a control device CONT controlling thereto.

The substrate loading chamber SLC has an accommodation room RMA accommodating a film substrate F formed to be shaped like a belt. The accommodation room RMA is provided with a spindle portion SF1 around which the film substrate F is twisted. The spindle portion SF1 is disposed to be extended in the Y direction, and is provided to be rotatable in the θY direction. The accommodation room RMA is connected to an inert gas supply part 133 and a discharge part 134. The accommodation room RMA is provided with a substrate transporting mechanism FAL transporting the film substrate F. As the substrate transporting mechanism FAL, for example, a roller mechanism and the like can be used.

The substrate processing chamber SPC includes an accommodation room RMB. The accommodation room RMB is connected to the accommodation room RMA of the substrate loading chamber SLC via an opening OP1. The accommodation room RMB is provided with a coating part CT, a substrate transporting unit FAP, a heating part HT, a nozzle tip managing part MN, a loading-side shutter portion SH1, and an unloading-side shutter portion SH2. The accommodation room RMB is connected to the inert gas supply part 133 and the discharge part 134.

The coating part CT includes a nozzle NZ and a nozzle driving mechanism NA. The nozzle NZ, for example, is formed so as to have a tapered configuration in a −Z-direction-side end portion. The nozzle NZ is configured to be able to eject the liquid material from the −Z-direction-side end portion (tip). The nozzle driving mechanism NA drives the nozzle NZ in the X direction, in the Y direction, or in the Z direction.

The substrate transporting unit FAP is configured to transport the film substrate F under the −Z direction side of the nozzle NZ. The substrate transporting unit FAP has two or more roller portions. By arranging the two or more roller portions, a transporting path of the film substrate F is determined so that the film substrate F passes under the −Z direction side of the nozzle NZ.

Each of the heating part HT is disposed on the +Z direction and −Z direction sides of the transporting path of the film substrate F so as to interpose the film substrate F therebetween in the Z direction. As the heating part HT, for example, the same configuration of the above-described embodiment as the heating part HT may be used. By deposing each of the heating part HT on the +Z direction and −Z direction sides of the film substrate F, a drying process and a heating process can efficiently proceed.

The nozzle tip managing part MN maintains a tip of the nozzle NZ. The nozzle tip managing part MN, for example, is disposed within a movable range of the nozzle NZ and is provided with a part which cleans the tip of the nozzle NZ, a part which performs a preliminary ejection of the nozzle NZ, a part which dries the tip of the nozzle NZ, and the like.

The loading-side shutter portion SH1 is an opening and closing mechanism by which the accommodation room RMA of the substrate loading chamber SLC and the accommodation room RMB of the substrate processing chamber SPC can be opened or closed. The loading-side shutter portion SH1 is configured to be movable in the Z direction by a driving mechanism (not shown) and the like. FIG. 12 shows the loading-side shutter portion SH1 is closed.

The unloading-side shutter portion SH2 is an opening and closing mechanism by which the accommodation room RMB and the substrate unloading chamber SUC of the accommodation room RMC can be opened or closed. The unloading-side shutter portion SH2 is configured to be movable in the Z direction by a driving mechanism (not shown) and the like. FIG. 12 shows the unloading-side shutter portion SH2 is closed.

The substrate unloading chamber SUC has the accommodation room RMC accommodating the film substrate F. The accommodation room RMC is connected to the accommodation room RMB of the substrate processing chamber SPC via an opening OP2. The accommodation room RMC is provided with a spindle portion SF2 around which the film substrate F is taken up. The spindle portion SF2 is disposed to be extended in the Y direction, and is provided to be rotatable in the θY direction. The accommodation room RMC is connected to the inert gas supply part 133 and the discharge part 134. The accommodation room RMC is provided with a substrate transporting mechanism FAU transporting the film substrate F. As the substrate transporting mechanism FAU, for example, a roller mechanism and the like can be used.

Next, an operation of a coating apparatus having the above configuration will be described.

Initially, the film substrate F is twisted around the spindle portion SF1. After the control device CONT opens the loading-side shutter portion SH1 and the unloading-side shutter portion SH2, the control device CONT appropriately controls a supply amount by the inert gas supply part 133 and a discharge amount by the discharge part 134, thereby the control device CONT controls the ambience of the accommodation room RMA, the accommodation room RMB, and the accommodation room RMC.

Thereafter, the control device CONT rotates the spindle portion SF1 in the +θY direction to transport the film substrate F to the +X direction side. The film substrate F is transported from the accommodation room RMA to the accommodation room RMB through the opening OP1. By rotating the roller portion forming the substrate transporting mechanism FAP in the accommodation room RMB, the control device CONT transports the film substrate F to the +X direction side.

When the film substrate F is transported under the −Z direction side of the nozzle NZ, the control device CONT ejects the liquid material toward the film substrate F from the nozzle NZ at a predetermined time. By the operation, the liquid material Q applied to a predetermined region of the film substrate F. By repetitively performing the operation, the coating film of the liquid material Q can be formed on each predetermined region of the film substrate F continuously passing under the −Z direction side of the nozzle NZ.

By transporting the film substrate F, the region which the liquid material Q is coated reaches a space interposed between two heating parts HT. At this time, by operating at least one of the two heating parts HT, the control device CONT performs the drying treatment or the heat treatment for the liquid material Q applied to the film substrate F.

The control device CONT unloads the region of the film substrate F performed the drying treatment or the heat treatment to the accommodation room RMC of the substrate unloading chamber SUC through the opening OP2. When the tip of the film substrate F reaches the spindle portion SF2 of the accommodation room RMC, the control device CONT rotates the spindle portion SF2 to take up the film substrate F around the spindle portion SF2. When all the film substrate F is taken up around the spindle portion SF2, the control device CONT closes the loading-side shutter portion SH1 and the unloading-side shutter portion SH2.

When the loading-side shutter portion SH1 and the unloading-side shutter portion SH2 are in a closed state, it becomes possible to be blocked out between the accommodation room RMA and the accommodation room RMB, and between the accommodation room RMB and the accommodation room RMC respectively. Thus, for example, after all the film substrate F to be accommodated into the accommodation room RMA are loaded into the substrate processing chamber SPC, while the loading-side shutter portion SH1 is in a closed state, the spindle portion SF1 is exchanged. In the same manner, for example, after all the film substrate F are taken up around the accommodation room RMC, while the unloading-side shutter portion SH2 is in a closed state, the spindle portion SF2 is exchanged. As described above, even when the liquid material Q is applied to the belt-like film, the present invention is applicable.

INDUSTRIAL APPLICABILITY

According to the present invention, since it is possible to evenly coat the liquid material on the substrate, the present invention is industrially applicable.

REFERENCE SIGNS LIST

CTR: COATING APPARATUS; LL: LOAD LOCK UNIT; CB1: FIRST CHAMBER DEVICE; CB2: SECOND CHAMBER DEVICE; RML, RM1, RM2: ACCOMMODATION ROOM; SAL, SA1, SA2: SUBSTRATE ACTUATOR MECHANISM; CT: COATING PART; NZ: SLIT NOZZLE; NZa: TIP PORTION; Q: LIQUID MATERIAL; AF: AFFINITY CONTROL PART; NA: NOZZLE DRIVING MECHANISM; R1: COATING SPACE; R2: POST-COATING, TRANSPORTING SPACE; HT: HEATING PART; CONT: CONTROL DEVICE; 21: NOZZLE OPENING; S: SUBSTRATE.

What is claimed is:

1. A coating apparatus comprising:
   a coating part comprising a slit nozzle configured to eject a liquid material including an oxidizable metal and hydrazine from a rectangular ejection opening provided at a tip portion of the slit nozzle on a substrate,
   a control device configured to eject the liquid material from the slit nozzle so as to interpose and hold the liquid between the tip portion and the substrate, and
   a relative driving unit configured to move the substrate and the nozzle in relation to each other, and the tip portion and the substrate facing each other,
   at least an outer surface of the tip portion of the nozzle and an outer surface adjacent to the outer surface of the tip portion of the nozzle being provided with an affinity control part which is formed by using at least one of titanium and titanium alloy, so that an affinity between the affinity control part and the hydrazine is less than that between the hydrazine and the substrate.

2. The coating apparatus according to claim 1, wherein the substrate is formed from molybdenum.

3. The coating apparatus according to claim 1, wherein the metal comprises at least one selected from the group consisting of copper, indium, gallium and selenium.

4. The coating apparatus according to claim 1, wherein the coating apparatus further comprises a chamber surrounding at least one of a coating space, in which the liquid material is coated by the coating part, and a post-coating, transporting space for the substrate on which the liquid material is coated.

5. The coating apparatus according to claim 4, wherein the coating apparatus further comprises an inert gas supply part configured to supply an inert gas to the space surrounded by the chamber.

6. The coating apparatus according to claim 1, wherein the ejection opening of the coating part ejects the liquid material to an ejecting region facing to the tip portion, and
   the relative driving unit contains a substrate transporting unit configured to transport the substrate past the ejecting region.

7. The coating apparatus according to claim 1, wherein the ejection opening of the coating part ejects the liquid material to an ejecting region facing to the tip portion, and
   the relative driving unit contains a nozzle driving unit configured to drive the nozzle so that the ejecting region moves along the surface of the substrate.

8. A method of coating a liquid material including an oxidizable metal and hydrazine on a substrate, comprising:
   directing a tip portion of a coating part, which comprises a slit nozzle configured to eject the liquid material from a rectangular ejection opening formed on the tip portion, to the substrate, at least an outer surface of the tip portion in the nozzle and an outer surface adjacent to the outer surface of the tip portion of the nozzle being provided with an affinity control part which is formed by using at least one of titanium and titanium alloy, so that affinity between the affinity control part and the hydrazine is less than that between the hydrazine and the substrate;
   ejecting the liquid material from the ejection opening so that the liquid material is interposed and held between the tip portion and the substrate; and
   moving the tip portion and the substrate in relation to each other while ejecting the liquid material from the ejection opening with the liquid material being interposed and held between the tip portion and the substrate.

* * * * *